US006264785B1

(12) United States Patent
Ikeda

(10) Patent No.: US 6,264,785 B1
(45) Date of Patent: Jul. 24, 2001

(54) MOUNTING STRUCTURE OF ELECTRIC PART AND MOUNTING METHOD THEREOF

(75) Inventor: Haruhiko Ikeda, Shiga-ken (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/075,394

(22) Filed: May 8, 1998

(30) Foreign Application Priority Data

May 12, 1997 (JP) ..................................... 9-120771

(51) Int. Cl.[7] .............................. H05K 3/32; B32B 31/12
(52) U.S. Cl. .................................. 156/273.3; 156/275.7; 156/330; 29/832; 257/781; 257/783
(58) Field of Search ................................ 156/291, 330, 156/273.3, 275.7, 272.2; 29/832; 257/750, 753, 778, 781, 783; 361/760, 767, 771; 252/512, 514, 519.3, 519.33, 521.6, 520.2

(56) References Cited

U.S. PATENT DOCUMENTS 5,310,830 * 5/1994 Okitsu et al. ......................... 525/502
5,844,320 * 12/1998 Ono et al. ............................ 257/778

* cited by examiner

Primary Examiner—Michael W. Ball
Assistant Examiner—Michael A. Tolin
(74) Attorney, Agent, or Firm—Ostrolenk, Faber, Gerb & Soffen, LLP

(57) ABSTRACT

The invention provides a mounting structure of an electronic part comprising an electronic part element (3) in association with a terminal electrode (5) and mounted on a substrate (7) via an adhesive (11) characterized in that a functional group having a nucleophilic substituting property is on a surface of said terminal electrode (5) and said terminal electrode (5) is bonded to said adhesive (11) by interatomic bonding. The invention also provide a method of mounting the electronic part. Bonding strength between the electronic part and the substrate is provided by not only mechanical bonding but also chemical bonding.

5 Claims, 2 Drawing Sheets

MOUNTING STRUCTURE OF ELECTRIC PART AND MOUNTING METHOD THEREOF

BACKGROUND OF THE INVENTION

1. Technical Field of the Invention

The present invention relates to a mounting structure of an electronic part comprising an electronic part element in association with a terminal electrode and mounted on a substrate via an adhesive. The present invention further relates to a method of mounting the electronic part.

2. Art Related to the Invention

Soldering has been widely used to mount an electronic part on a substrate. To improve the soldering properties of an external electrode of the electronic part, soft solder, tin plating, gold plating, etc., is applied. Recently, there has been a tendency not to use soft solders containing lead.

An electrically conductive adhesive is often used to mount the electronic part on the substrate. However, because the conventional surface treatment, i.e., soft solder, tin plating, gold plating, etc., has been performed on the external electrodes of the electronic part, the bonding strength between the substrate and the electronic part constitutes a relatively weak mechanical bond.

SUMMARY OF THE INVENTION

An object of the present invention is to provide an electronic part mounting structure wherein the bonding strength of the electronic part and a substrate can be improved by not only mechanical bonding but also chemical bonding, and to a mounting method thereof.

The present invention provides an electronic part mounting structure of the above mentioned kind, which is characterized in that a functional group having a nucleophilic substituting property is on a surface of said terminal electrode; and said terminal electrode is bonded to said adhesive by interatomic bonding.

As a result of interatomic bonding between the functional group having a nucleophilic substituting property in the terminal electrode and the functional group of a resin in the adhesive, not only is there an anchor effect by mechanical bonding as in the conventional case but also there is chemical bonding. Thus, the bond strength of the electronic part and the substrate is far more improved.

In the above described mounting structure of an electronic part, said functional group having the nucleophilic substituting property is preferably a hydroxy radical. By interatomic bonding (hydrogen bonding) between the hydroxy radical and a functional group of a resin in the adhesive, the effect as described above is obtained.

In the above described mounting structure of an electronic part, said adhesive may include an epoxy resin. By interatomic bonding between the functional group (e.g., hydroxy radical) having the nucleophilic property in the terminal electrode and the epoxy group in the adhesive, the above-described effect is obtained.

In the above described mounting structure of an electronic part, said adhesive may also be an electrically conductive adhesive including an electrically conductive powder.

Another aspect of the present invention provides a method of mounting an electronic part comprising the steps of: 1) preparing an electrically conductive paste comprising an electrically conductive powder, a photocatalyst and an organic vehicle; 2) coating said electrically conductive paste on an electronic part element and firing said electrically conductive paste to form a terminal electrode; 3) irradiating said terminal electrode; 4) coating an adhesive on said terminal electrode; and 5) mounting said electronic part on a substrate via said adhesive.

By irradiating the terminal electrode including the photocatalyst, a functional group enriched with nucleophilic substituting properties is formed on the surface of the terminal electrode and by interatomic bonding between the functional group and a functional group of a resin in the adhesive, the above-described effect is obtained.

In the above described method, said photocatalyst may be anatase-type $TiO_2$. The use of anatase-type $TiO_2$ is effective in that the method can be safely and easily realized.

In the above described method, said radiation may be an ultraviolet ray. The use of ultraviolet rays is effective in efficiently and safely irradiating.

PREFERRED EMBODIMENTS OF THE PRESENT INVENTION

Other features and advantages of the present invention will become apparent from the following description of the invention which refers to the accompanying drawings.

The type of the electronic part is not restricted. It may be, for example, a laminated condenser, semiconductor element, elastic surface wave element, resonator, oscillator, thin film circuit element and the like.

The terminal electrode of the electronic part may be, for example, an external electrode of an laminated condenser or a wiring circuit of a semiconductor element.

The term substrate means lands, base plates, lead frames, metal plates, etc.

The adhesive may be an electrically conductive adhesive or an insulating adhesive. Also, a resin without additives can be used as the adhesive.

The functional group having a nucleophilic substituting property means a group having a tendency of sharing an electron with another functional group, i.e., a group capable of hydrogen bonding to another group. Examples include hydroxy ($OH^-$), alkoxy ($RO^-$ for instance methoxy and the like), cyano ($CN^-$), halo ($F^-$, $Cl^-$, $Br^-$, $I^-$), etc.

The photocatalyst is not restricted as long as the catalyst causes formation of the functional group as a result of irradiation. One typical example is anatase-type $TiO_2$.

As the electrically conductive powder, various powders such as Ag/Pd, Cu, Ag, etc., can be used.

The present invention is more practically explained below but the invention is not limited to the example.

Figure 1:
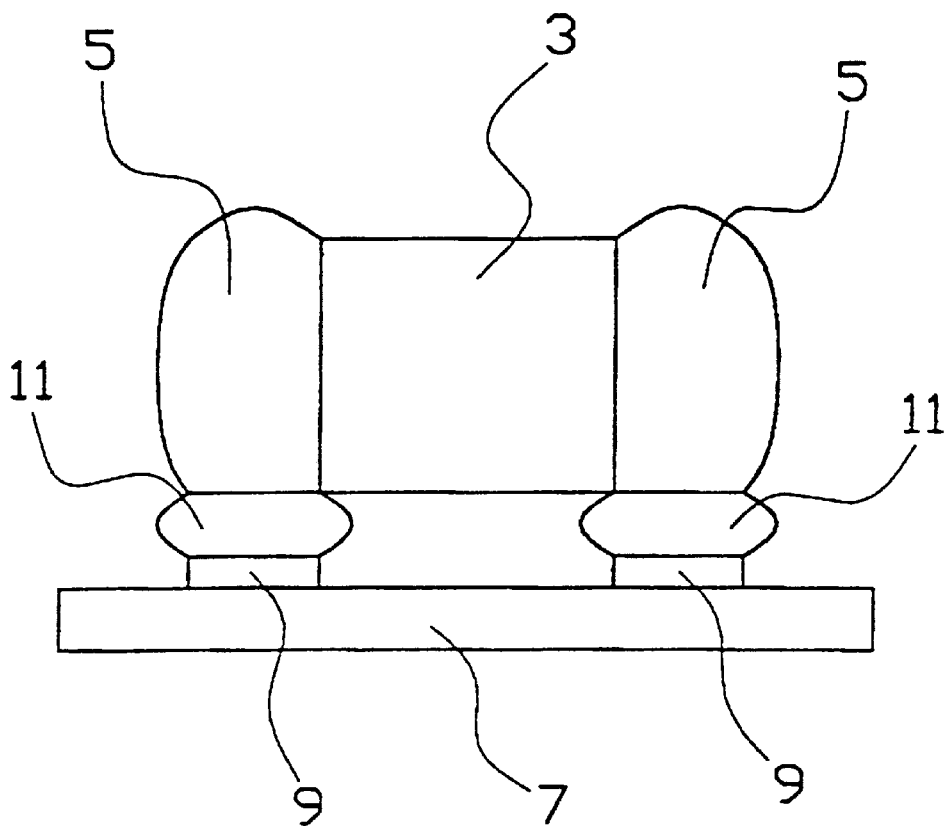
FIG. 1 is a side view showing a mounting structure of an electronic part, which is an example of the present invention.

FIG. 1 is a side view showing a mounting structure of electronic parts, which is an example of the present invention.

As shown in FIG. 1, a mounting structure 1 of a laminated condenser, which is an electronic part, is composed of an electronic part element 3 made up of a ceramic material, external electrodes 5 (terminal electrodes) formed at both ends of the electronic part element 3, a wiring base plate 7 (substrate) made up of a glass epoxy material, wiring electrodes 9 formed on the wiring base plate 7, and an epoxy electrically conductive adhesive 11 connecting the external electrodes 5 to the wiring electrodes 9. In addition, while not shown in the figure, a series of internal electrode layers can be alternately connected to each of the external electrode 5 with ceramic layers therebetween in the inside of the electronic part element 3.

Figure 3:
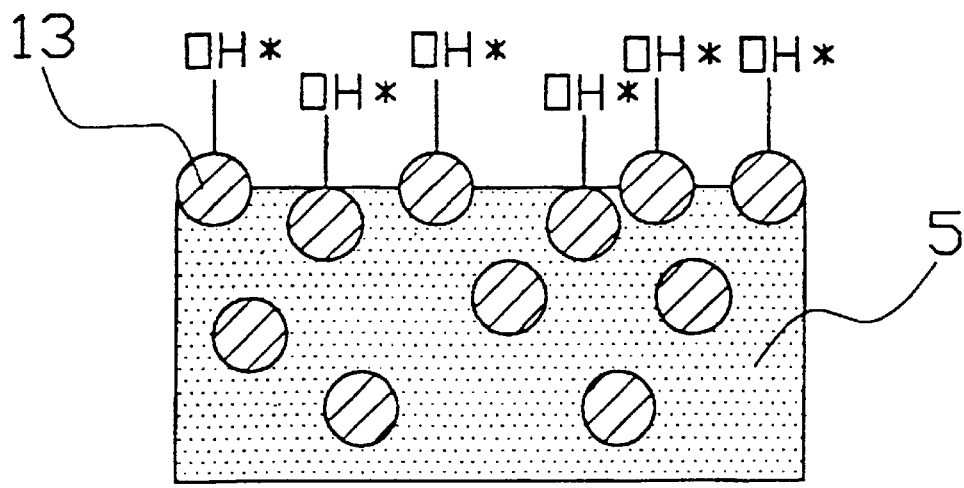
FIG. 3 is a schematic view of an external electrode of an electronic part.
Figure 4:
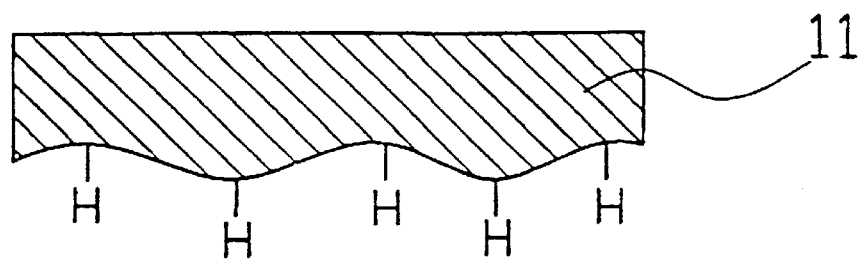
FIG. 4 is a schematic view of an external electrode and an electrically conductive adhesive of an electronic part.
Figure 4:
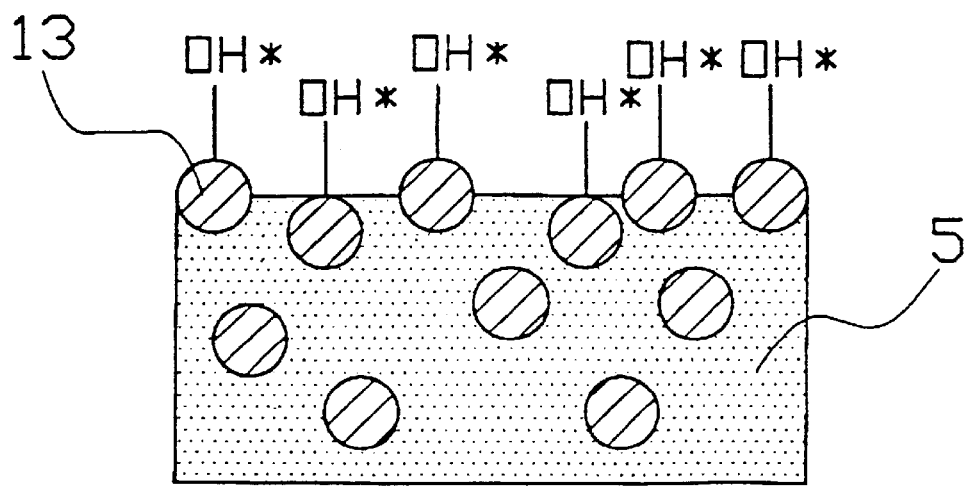

Next, a electronic part mounting method, which is an example of the present invention, is explained with reference to FIG. 2 to FIG. 4, schematic views showing the external electrode of the electronic part and the electrically conductive adhesive.

(1) First, an electrically conductive paste is prepared by mixing an Ag/Pd powder, anatase-type $TiO_2$ 13 (photocatalyst) and an organic vehicle. If desired or necessary, a glass frit may be added.

Figure 2:
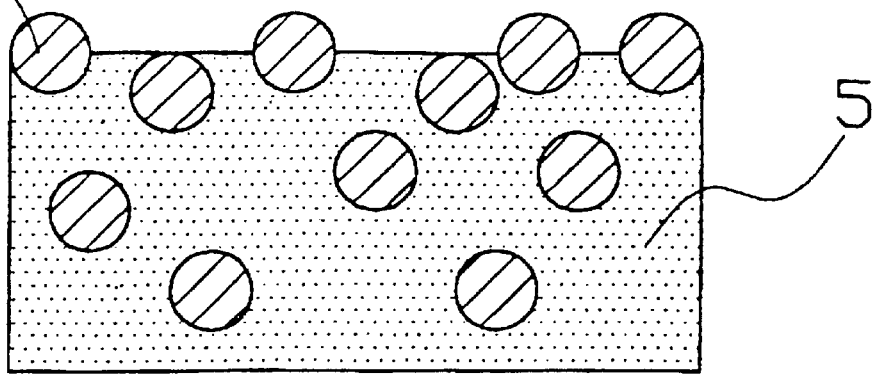
FIG. 2 is a schematic view of an external electrode of an electronic part.

(2) Then, the electrically conductive paste is coated on both end portions of a sintered electronic part element 3 by for instance a dipping method and thereafter the element is dried and burned to form the external electrodes 5 (FIG. 2).

(3) Thereafter, when irradiating the external electrodes 5 with ultraviolet rays, the anatase-type $TiO_2$ 13 on the surface of the external electrodes 5 acts as a photocatalyst. That is, adsorbed water (air moisture) on the surface of the external electrodes is caused to form hydroxy radicals (OH*)(FIG. 3).

(4) Next, an electrically conductive adhesive 11 is coated on the external electrodes 5. In this case, the epoxy group in the electrically conductive adhesive 11 undergoes hydrogen bonding with the hydroxy radical (OH*) of the external electrode 5 to form strong bonds (FIG. 4).

(5) Also, the external electrodes 5 are mechanically connected to the wiring electrodes 9 via the electrically conductive adhesive 11 to mount the electric part on the wiring base plate 7.

While the invention has been particularly shown and described with reference to preferred embodiments thereof, it will be understood by those skilled in the art that the forgoing and other changes in form and details may be made therein without departing from the spirit of the invention.

What is claimed is:

1. A method of mounting an electronic part, comprising the steps of providing a substrate, an adhesive and an electrical part having a terminal electrode, and bonding said electrode to said substrate with said adhesive, wherein said terminal electrode comprises a functional group capable of hydrogen bonding to an epoxy adhesive and said adhesive comprises an epoxy adhesive and wherein said electrode is irradiated to form said functional group on a surface thereof.

2. The method according to claim 1, comprising a) providing an electrically conductive paste comprising an electrically conductive powder, a photocatalyst and an organic vehicle;

b) coating said electrically conductive paste on an electronic part and converting said electrically conductive paste into a terminal electrode containing said photocatalyst;

c) irradiating said terminal electrode;

d) coating an epoxy adhesive on said terminal electrode; and e) mounting said electronic part on a substrate via said adhesive.

3. The method according to claim 2, characterized in that said photocatalyst is anatase-type $TiO_2$.

4. The method according to claim 3, characterized in that said irradiation comprises an ultraviolet ray.

5. The method according to claim 1, characterized in that said irradiation comprises an ultraviolet ray.

* * * * *